US011862253B2

(12) United States Patent
Kim

(10) Patent No.: US 11,862,253 B2
(45) Date of Patent: Jan. 2, 2024

(54) DATA OUTPUT CONTROL CIRCUIT AND SEMICONDUCTOR APPARATUS INCLUDING THE SAME

(71) Applicant: SK hynix Inc., Icheon-si (KR)

(72) Inventor: Kwang Soon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 17/578,156

(22) Filed: Jan. 18, 2022

(65) Prior Publication Data
US 2023/0064351 A1 Mar. 2, 2023

(30) Foreign Application Priority Data
Aug. 30, 2021 (KR) .................. 10-2021-0114791

(51) Int. Cl.
*G11C 16/26* (2006.01)
*G11C 16/32* (2006.01)
*G11C 16/08* (2006.01)
*H03K 19/20* (2006.01)
*G11C 16/10* (2006.01)

(52) U.S. Cl.
CPC .............. *G11C 16/26* (2013.01); *G11C 16/08* (2013.01); *G11C 16/32* (2013.01); *G11C 16/10* (2013.01); *H03K 19/20* (2013.01)

(58) Field of Classification Search
CPC ......... G11C 16/26; G11C 16/08; G11C 16/32; G11C 16/10; G11C 7/1066; G11C 7/222; G11C 8/10; H03K 19/20
USPC ................................................... 365/185.112
See application file for complete search history.

(56) References Cited

U.S. PATENT DOCUMENTS

| 8,432,769 | B2 | 4/2013 | Moon |
| 9,859,877 | B2 | 1/2018 | Jung |
| 9,998,126 | B1 * | 6/2018 | Hailu .................... H03L 7/0814 |

FOREIGN PATENT DOCUMENTS

| DE | 102016213445 | A1 * | 11/2017 | .............. H02M 1/08 |
| JP | 3612803 | B2 * | 1/2005 | .............. H04N 5/361 |
| TW | 201304418 | A * | 1/2013 | .............. H03L 7/08 |

* cited by examiner

*Primary Examiner* — Fernando Hidalgo
(74) *Attorney, Agent, or Firm* — William Park & Associates Ltd.

(57) ABSTRACT

A data output control circuit includes a dividing circuit, a timing signal generating circuit and a control signal generating circuit. The dividing circuit divides read enable signals to generate multiple phase clock signals. The timing signal generating circuit generates a plurality of timing signals based on warming-up cycle information and the multiple phase clock signals. The control signal generating circuit generates data output control signals based on the multiple phase clock signals and the plurality of timing signals.

15 Claims, 9 Drawing Sheets

DATA OUTPUT CONTROL CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2021-0114791, filed on Aug. 30, 2021, in the Korean Intellectual Property Office, which is incorporated herein by reference in its entirety as set forth in full.

BACKGROUND

1. Technical Field

Various embodiments generally relate to a semiconductor circuit, and, more particularly, to a data output control circuit and a semiconductor apparatus including the same.

2. Related Art

A semiconductor memory apparatus as an example of a semiconductor apparatus may store externally provided data into a memory region and may output data from the memory region to an external of the semiconductor memory apparatus. In order to improve the high-speed operation and operation reliability of the semiconductor memory apparatus, it is very important to control data input/output timings.

SUMMARY

In an embodiment, a data output control circuit may include a dividing circuit, a timing signal generating circuit and a control signal generating circuit. The dividing circuit may be configured to divide read enable signals to generate multiple phase clock signals. The timing signal generating circuit may be configured to generate a plurality of timing signals based on warming-up cycle information and the multiple phase clock signals. The control signal generating circuit may be configured to generate data output control signals based on the multiple phase clock signals and the plurality of timing signals.

In an embodiment, a semiconductor apparatus may include a memory cell array, a data input/output circuit and a control circuit. The data input/output circuit may be configured to output data from the memory cell array to an external device in response to data output control signals. The control circuit may be configured to generate the data output control signals by dividing read enable signals, which are provided from another external device, to generate multiple phase clock signals and by selectively masking the multiple phase clock signals based on warming-up cycle information that is set for the semiconductor apparatus.

DETAILED DESCRIPTION

According to an embodiment, provided may be a data output control circuit capable of improving control performance for a data output timing and a semiconductor apparatus including the same.

Hereinafter, exemplary embodiments of the present disclosure will be described below with reference to the accompanying drawings.

Figure 1:
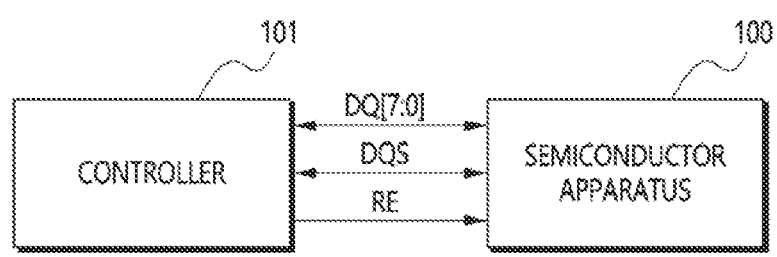
FIG. 1 is a diagram illustrating a configuration of a semiconductor system 10 in accordance with an embodiment.

FIG. 1 is a diagram illustrating a configuration of a semiconductor system 10 in accordance with an embodiment.

Referring to FIG. 1, the semiconductor system 10 may include a semiconductor apparatus 100 and a controller 101. The semiconductor apparatus 100 may operate based on the control of the controller 101. In response to a write command that is provided from the controller 101, the semiconductor apparatus 100 may write data into a memory cell array 110. When receiving a write command, an address and data from the controller 101, the semiconductor apparatus 100 may write the data into memory cells that correspond to the address.

In response to a read command that is provided from the controller 101, the semiconductor apparatus 100 may perform a read operation. When receiving a read command and an address from the controller 101, the semiconductor apparatus 100 may read data from memory cells that correspond to the address to output the read data to the controller 101.

The semiconductor apparatus 100 may include at least one of the NAND flash memory, the vertical NAND (hereinafter, referred to as a 'VNAND'), the NOR flash memory, the resistive random access memory (RRAM), the phase-change memory (PRAM), the magneto-resistive random access memory (MRAM), the ferroelectric random access memory (FRAM), the spin transfer torque random access memory (STT-RAM). In an embodiment, the semiconductor apparatus 100 may be implemented to have a three-dimensional array structure. In an embodiment, the semiconductor apparatus 100 may be applied to a flash memory apparatus with a charge storage layer comprising a conductive floating gate as well as the charge trap flash (CTF) with a charge storage layer comprising an insulating layer.

The controller 101 may be coupled between the semiconductor apparatus 100 and a host. The host may include a central processing unit (CPU), a graphic processing unit (GPU), and so forth. The controller 101 may be configured to interface the host and the semiconductor apparatus 100. Based on the control of the host, the controller 101 may provide the semiconductor apparatus 100 with a write command and a read command.

Coupled between the controller 101 and the semiconductor apparatus 100 may be signal lines configured to transfer data DQ[7:0], a signal line configured to transfer a data strobe signal DQS, and a signal line configured to transfer a read enable signal RE. The read enable signal RE may be provided from the controller 101. The read enable signal RE may include signals of a complementary form and may be referred to as an external clock signal. FIG. 1 exemplifies the data DQ[7:0] with 8 bits, however, the data may comprise 16 bits, 32 bits, and so forth.

The data strobe signal DQS may be a bi-directional signal. During a data output operation of the semiconductor apparatus 100, the data strobe signal DQS may be provided from the semiconductor apparatus 100 to the controller 101. While data is input to the semiconductor apparatus 100, the data strobe signal DQS may be provided from the controller 101 to the semiconductor apparatus 100.

After the read enable signal RE is provided to the semiconductor apparatus 100, the data DQ[7:0] may be output based on the data strobe signal DQS. When data is transferred between the controller 101 and the semiconductor apparatus 100, a data transmission timing may be adjusted by a warming-up cycle that is defined in an operational specification of the semiconductor apparatus 100. According to the operational specification of the semiconductor apparatus 100, data should be output after the warming-up cycle elapses with reference to the read enable signal RE.

The warming-up cycle may be set as one of '0', '1', '2', and '4'. When the warming-up cycle is set as '0', data may be output in a first cycle of the read enable signal RE without performing warming-up. When the warming-up cycle is set as '1', data that is output may be delayed in the first cycle of the read enable signal RE and data may be output in a second cycle of the read enable signal RE. When the warming-up cycle is set as '2', data that is output may be delayed in the first and second cycles of the read enable signal RE and data may be output in a third cycle of the read enable signal RE. When the warming-up cycle is set as '4', data that is output may be delayed in the first to fourth cycles of the read enable signal RE and data may be output in a fifth cycle of the read enable signal RE.

Figure 2:
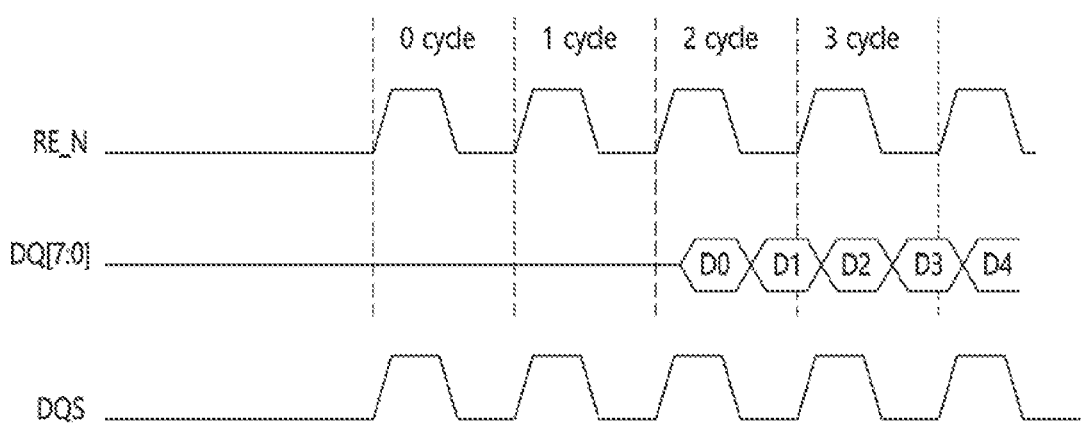
FIG. 2 is a diagram illustrating a data output timing according to a warming-up cycle of a semiconductor apparatus.

FIG. 2 is a diagram illustrating a data output timing according to a warming-up cycle of a semiconductor apparatus. FIG. 2 illustrates a read enable signal RE_N, the data DQ[7:0] and the data strobe signal DQS. The read enable signal RE may include signals of a complementary form as described above, and FIG. 2 illustrates the read enable signal RE_N as one of the signals of the complementary form.

When the warming-up cycle is set as '2', as illustrated in FIG. 2, data that is output may be delayed in the first and second cycles ("0 cycle" and "1 cycle") of the read enable signal RE_N and the data DQ[7:0] may be output based on the data strobe signal DQS in a third cycle ("2 cycle") of the read enable signal RE_N.

According to an embodiment, the semiconductor apparatus 100 may internally adjust the timings of the read enable signal RE_N to output data based on the warming-up cycle.

Figure 3:
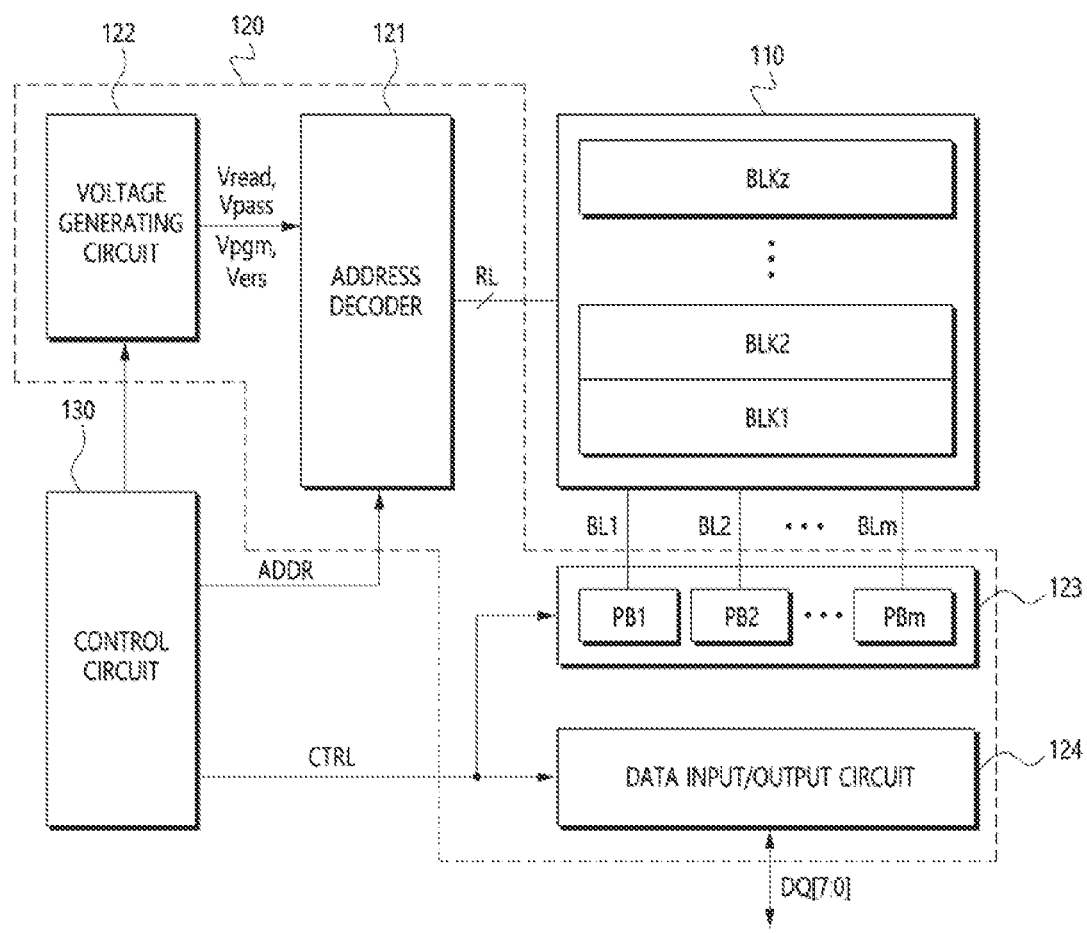
FIG. 3 is a diagram illustrating a configuration of a semiconductor apparatus 100 in accordance with an embodiment.

FIG. 3 is a diagram illustrating a configuration of the semiconductor apparatus 100 in accordance with an embodiment.

Referring to FIG. 3, the semiconductor apparatus 100 may include the memory cell array 110, a peripheral circuit 120 and a control circuit 130. The peripheral circuit 120 may include an address decoder 121, a voltage generating circuit 122, a read/write circuit 123 and a data input/output circuit 124.

The memory cell array 110 may be coupled to the address decoder 121 through row lines RL and may be coupled to the read/write circuit 123 through bit lines BL1 to BLm. The memory cell array 110 may include a plurality of memory blocks BLK1 to BLKz. The plurality of memory blocks BLK1 to BLKz may be coupled to the address decoder 121 through row lines RL. The plurality of memory blocks BLK1 to BLKz may be coupled to the read/write circuit 123 through the bit lines BL1 to BLm. Each of the plurality of memory blocks BLK1 to BLKz may include a plurality of memory cells. The plurality of memory cells may be non-volatile memory cells. Each of the plurality of memory blocks BLK1 to BLKz may include a plurality of pages. Among the plurality of memory cells, memory cells that are coupled to a single row line may be defined as a single page.

The memory cells may be configured by one or more of a single level cell (SLC) that is capable of storing therein a single data bit, a multi-level cell (MLC) that is capable of storing therein two data bits, a triple level cell (TLC) that is capable of storing therein three data bits and a quadruple level cell (QLC) that is capable of storing therein four data bits.

The peripheral circuit 120 may drive the memory cell array 110 to perform a program operation, a read operation, and an erase operation.

The address decoder 121 may be coupled to the memory cell array 110 through the row lines RL. The address decoder 121 may be configured to operate based on the control of the control circuit 130. The address decoder 121 may receive an address ADDR from the control circuit 130.

The address decoder 121 may decode a block address within the address ADDR. The address decoder 121 may select at least one of the plurality of memory blocks BLK1 to BLKz based on the decoded block address. The address decoder 121 may decode a row address within the address ADDR. According to the decoded row address, the address decoder 121 may select at least one of the row lines RL that are coupled to the selected memory block by applying voltages, which are provided from the voltage generating circuit 122, to the at least one row line RL.

The address decoder 121 may perform a program operation by applying a program voltage Vpgm to the selected row line and applying a pass voltage Vpass, which is lower than the program voltage Vpgm, to non-selected row lines.

The address decoder 121 may perform a read operation by applying a read voltage Vread to the selected row line and applying a pass voltage Vpass, which is higher than the read voltage Vread, to the non-selected row lines.

An erase operation may be performed in units of memory blocks within the semiconductor apparatus 100. The address decoder 121 may decode a block address and may select a single memory block based on the decoded block address. The address decoder 121 may perform an erase operation by applying a ground voltage to the row lines RL that are coupled to the selected memory block and applying an erase voltage Vers to a bulk region in which the selected memory block is formed.

The voltage generating circuit 122 may generate various voltages that are required for the semiconductor apparatus 100 to operate. The voltage generating circuit 122 may generate and provide the read voltage Vread, the pass voltage Vpass, the program voltage Vpgm, the erase voltage Vers, and so forth to the address decoder 121. In an embodiment, the voltage generating circuit 122 may include a plurality of pumping capacitors and may selectively activate, based on the control of the control circuit 130, the plurality of pumping capacitors to generate the plurality of voltages.

The read/write circuit 123 may include a plurality of page buffers, e.g., first to m-th page buffers PB1 to PBm. The first to m-th page buffers PB1 to PBm may be coupled to the memory cell array 110, respectively, through the first to m-th bit lines BL1 to BLm. The first to m-th page buffers PB1 to PBm may operate in response to control signals CTRL that are provided from the control circuit 130.

The first to m-th page buffers PB1 to PBm may perform data communication with the data input/output circuit 124. The first to m-th page buffers PB1 to PBm may perform a program operation by transferring to-be-stored data from the data input/output circuit 124 and data lines DL to the memory cell array 110. The read/write circuit 123 may perform a read operation by reading data from memory cells of a selected page through the bit lines BL1 to BLm and by providing the read data to the data input/output circuit 124. The read/write circuit 123 may perform an erase operation by floating the bit lines BL1 to BLm.

The data input/output circuit 124 may be coupled to the first to m-th page buffers PB1 to PBm through the data lines DL. In response to the control signals CTRL that are provided from the control circuit 130, the data input/output circuit 124 may perform data input/output operations. During a read operation, the data input/output circuit 124 may output data, which is provided from the first to m-th page buffers PB1 to PBm, to the controller 101 at timings based on the above-described warming-up cycle.

The control circuit 130 may be coupled to the address decoder 121, the voltage generating circuit 122, the read/write circuit 123, and the data input/output circuit 124. The control circuit 130 may be configured to control overall operations of the semiconductor apparatus 100. The control circuit 130 may operate in response to a command CMD provided from an external apparatus. During a read operation, the control circuit 130 may generate a data output control signal by internally adjusting timings of the read enable signal RE_N and may output the generated data output control signal as one of the control signals CTRL such that data is output based on the warming-up cycle. The control circuit 130 may output, as the data output control signal, a signal with timings, at which pulses, among pulses of the read enable signal RE_N, corresponding to the warming-up cycles are masked.

Figure 4:
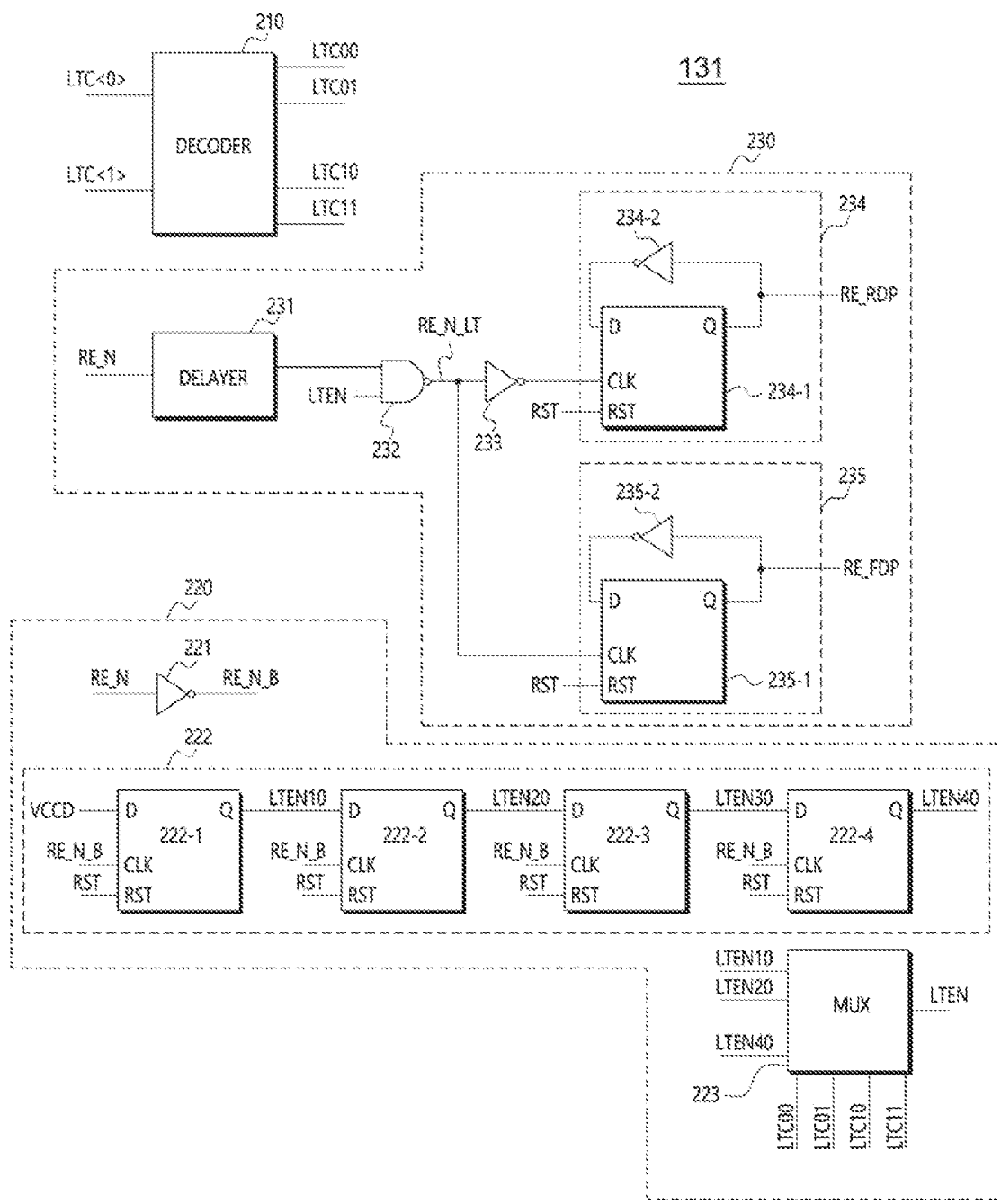
FIG. 4 is a diagram illustrating a configuration of a data output control circuit 131 in accordance with an embodiment.
Figure 5:
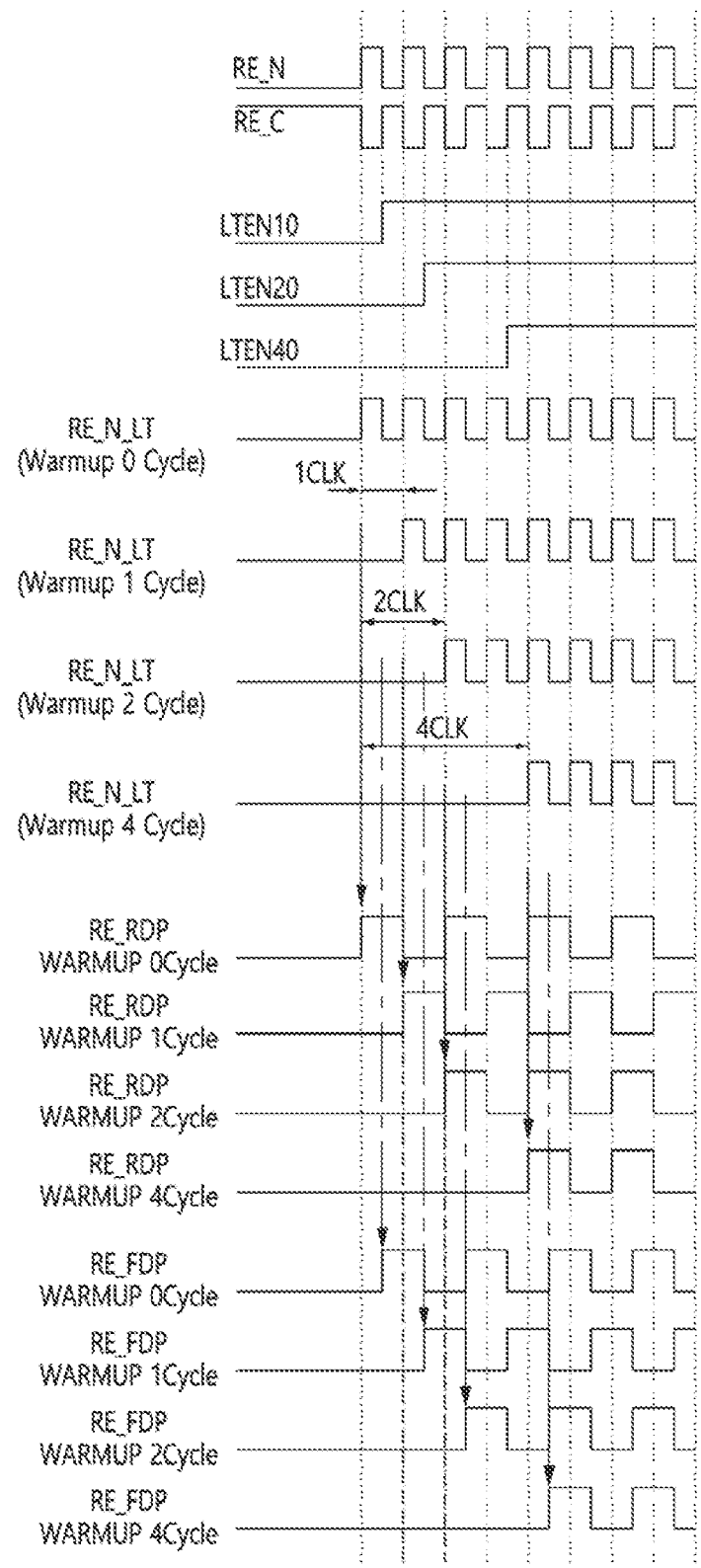
FIG. 5 is an operation timing diagram of the data output control circuit 131 in accordance with an embodiment.

FIG. 4 is a diagram illustrating a configuration of a data output control circuit 131 in accordance with an embodiment. FIG. 5 is an operation timing diagram of the data output control circuit 131 in accordance with an embodiment.

Hereinafter, described with reference to FIGS. 4 and 5 will be the configuration and operation of the data output control circuit 131 in accordance with an embodiment.

According to an embodiment, the data output control circuit 131 may be included in the control circuit 130 of FIG. 3, which is just an example. The arrangement of the data output control circuit 131 will not be limited thereto.

According to an embodiment, the data output control circuit 131 may include a decoder 210, a timing signal generating circuit 220, and a control signal generating circuit 230 as illustrated in FIG. 4.

The decoder 210 may decode warming-up cycle preliminary information LTC<0:1>, which is for setting the warming-up cycle, to generate warming-up cycle information LTC00, LTC01, LTC10, and LTC11. The warming-up cycle information LTC00 may correspond to a warming-up cycle '0', the warming-up cycle information LTC01 may correspond to a warming-up cycle '1', the warming-up cycle information LTC10 may correspond to a warming-up cycle '2', and the warming-up cycle information LTC11 may correspond to a warming-up cycle '4'. For example, the warming-up cycle of the semiconductor apparatus 100 may be set as '0' when only the warming-up cycle information LTC00, among the warming-up cycle information LTC00, LTC01, LTC10, and LTC11, has a high level. The warming-up cycle may be set as '1' when only the warming-up cycle information LTC01, among the warming-up cycle information LTC00, LTC01, LTC10, and LTC11, has a high level. The warming-up cycle may be set as '2' when only the warming-up cycle information LTC10, among the warming-up cycle information LTC00, LTC01, LTC10, and LTC11, has a high level. The warming-up cycle may be set as '4' when only the warming-up cycle information LTC11, among the warming-up cycle information LTC00, LTC01, LTC10, and LTC11, has a high level.

The timing signal generating circuit 220 may generate preliminary timing signals LTEN10, LTEN20, LTEN30, and LTEN40 based on the read enable signal RE_N and may output, as a timing signal LTEN, one of the preliminary timing signals LTEN10, LTEN20, LTEN30, and LTEN40 based on the warming-up cycle information LTC00, LTC01, LTC10, and LTC11. The timing signal generating circuit 220 may include a logic gate 221, a shift register 222, and a multiplexer 223.

The logic gate 221 may invert the read enable signal RE_N to generate an inverted read enable signal RE_N_B.

The shift register 222 may shift a power voltage VCCD based on the inverted read enable signal RE_N_B to generate the preliminary timing signals LTEN10, LTEN20, LTEN30, and LTEN40. The shift register 222 may include a plurality of flip-flops, e.g., first to fourth flip-flops 222-1 to 222-4. The first to fourth flip-flops 222-1 to 222-4 may commonly receive the inverted read enable signal RE_N_B as a reference signal for a shifting operation (i.e., a clock signal). The first flip-flop 222-1 may latch the level of the power voltage VCCD in response to the transition of the inverted read enable signal RE_N_B and may output the latched signal as the preliminary timing signal LTEN10. The second flip-flop 222-2 may latch the preliminary timing signal LTEN10 in response to the transition of the inverted read enable signal RE_N_B and may output the latched signal as the preliminary timing signal LTEN20. The third flip-flop 222-3 may latch the preliminary timing signal LTEN20 in response to the transition of the inverted read enable signal RE_N_B and may output the latched signal as the preliminary timing signal LTEN30. The fourth flip-flop 222-4 may latch the preliminary timing signal LTEN30 in response to the transition of the inverted read enable signal RE_N_B and may output the latched signal as the preliminary timing signal LTEN40.

Referring to FIG. 5, a pair of the read enable signals RE_N and RE_C may be input. The read enable signals RE_N and RE_C may have respective phases opposite to each other. The inverted read enable signal RE_N_B may have the same phase as the read enable signal RE_C.

With reference to rising edges of the inverted read enable signal RE_N_B, the preliminary timing signals LTEN10, LTEN20, LTEN30, and LTEN40 may sequentially transition to a high level.

According to the warming-up cycle information LTC00, LTC01, LTC10, and LTC11, the multiplexer 223 may output, as the timing signal LTEN, one of the preliminary timing signals LTEN10, LTEN20, and LTEN40. Here, the data output control circuit 131 of FIG. 4 is exemplified not to input the preliminary timing signal LTEN30 to the multiplexer 223 since the semiconductor apparatus 100 is sufficient to support the warming-up cycles '0', '1', '2', and '4' that are defined in the operational specification as mentioned earlier. The multiplexer 223 may output the preliminary timing signal LTEN10 as the timing signal LTEN when the warming-up cycle information LTC01, among the warming-up cycle information LTC00, LTC01, LTC10, and LTC11, has a high level. The multiplexer 223 may output the preliminary timing signal LTEN20 as the timing signal LTEN when the warming-up cycle information LTC10, among the warming-up cycle information LTC00, LTC01, LTC10, and LTC11, has a high level. The multiplexer 223 may output the preliminary timing signal LTEN40 as the timing signal LTEN when the warming-up cycle information LTC11, among the warming-up cycle information LTC00, LTC01, LTC10, and LTC11, has a high level. When the warming-up cycle information LTC00, among the warming-up cycle information LTC00, LTC01, LTC10, and LTC11, has a high level (i.e., when the warming-up cycle is not applied, the multiplexer 223 may output the timing signal LTEN to a high level at a timing prior to a timing when the preliminary timing signal LTEN10 transitions to a high level).

The control signal generating circuit 230 may generate data output control signals RE_RDP and RE_FDP by utilizing a signal, which masks pulses, among pulses of the read enable signal RE_N, corresponding to the warming-up cycle, based on the timing signal LTEN. Between the data output control signals RE_RDP and RE_FDP, the data output control signal RE_RDP may be referred to as a first data output control signal RE_RDP, and the data output control signal RE_FDP may be referred to as a second data output control signal RE_FDP.

The control signal generating circuit 230 may include a delayer 231, logic gates 232 and 233, and oscillators 234 and 235.

The delayer 231 may delay the read enable signal RE_N by a predetermined amount of time to drive the read enable signal RE_N after the predetermined amount of time. The delayer 231 may be configured to compensate for delay of signal processing of the timing signal generating circuit 220. That is, the delayer 231 may be designed to have a delay amount that corresponds to the delay of signal processing of the timing signal generating circuit 220.

The first logic gate 232 may perform a NAND operation on an output signal of the delayer 231 and the timing signal LTEN to output a signal RE_N_LT. The second logic gate 233 may invert the signal RE_N_LT that is output from the first logic gate 232.

Referring to FIG. 5, the signal RE_N_LT that is output from the first logic gate 232 may have the same waveform as the read enable signal RE_N when the warming-up cycle is set as '0'. The signal RE_N_LT may have a waveform, which masks a first cycle of the read enable signal RE_N, when the warming-up cycle is set as '1'. The signal RE_N_LT may have a waveform, which masks the first and second cycles of the read enable signal RE_N, when the warming-up cycle is set as '2'. The signal RE_N_LT may have a waveform, which masks the first to fourth cycles of the read enable signal RE_N, when the warming-up cycle is set as '4'.

The first oscillator 234 may perform an oscillation operation in response to an output signal of the second logic gate 233 to generate the first data output control signal RE_RDP of the data output control signals RE_RDP and RE_FDP.

The first oscillator 234 may include a flip-flop 234-1 and a logic gate 234-2. The flip-flop 234-1 may generate the first data output control signal RE_RDP by repeating an operation of receiving, as a clock signal, the output signal of the second logic gate 233 and of receiving, as a feed-back signal from the logic gate 234-2, an inverted signal of an output terminal level in response to the transition of the output signal of the second logic gate 233, the logic gate 234-2 inverting the output terminal level to generate the inverted signal.

Referring to FIG. 5, the first data output control signal RE_RDP may start the transition thereof with reference to rising edges of the signal RE_N_LT based on the respective warming-up cycles '0', '1', '2', and '4' and may have a half frequency of the signal RE_N_LT.

The second oscillator 235 may perform an oscillation operation in response to an output signal of the first logic gate 232 to generate the second data output control signal RE_FDP of the data output control signals RE_RDP and RE_FDP. The second oscillator 235 may include a flip-flop 235-1 and a logic gate 235-2. The flip-flop 235-1 may generate the second data output control signal RE_FDP by repeating an operation of receiving, as a clock signal, the output signal of the first logic gate 232 and of receiving, as a feed-back signal from the logic gate 235-2, an inverted signal of an output terminal level in response to the transition of the output signal of the first logic gate 232, the logic gate 235-2 inverting the output terminal level to generate the inverted signal.

Referring to FIG. 5, the second data output control signal RE_FDP may start the transition thereof with reference to falling edges of the signal RE_N_LT based on the respective warming-up cycles '0', '1', '2', and '4' and may have a half frequency of the signal RE_N_LT.

As described above, the data output control circuit 131, according to an embodiment, may generate the data output control signals RE_RDP and RE_FDP based on the signal, which masks the pulses of the read enable signal RE_N to support the warming-up cycle.

Therefore, when the warming-up cycle is set as '0' (i.e., when the warming-up cycle is not applied), the semiconductor apparatus 100 may output data based on the data output control signals RE_RDP and RE_FDP from the first cycle of the read enable signal RE_N.

When the warming-up cycle is set as '1', the semiconductor apparatus 100 may output data based on the data output control signals RE_RDP and RE_FDP from the second cycle of the read enable signal RE_N.

When the warming-up cycle is set as '2', the semiconductor apparatus 100 may output data based on the data output control signals RE_RDP and RE_FDP from the third cycle of the read enable signal RE_N.

When the warming-up cycle is set as '4', the semiconductor apparatus 100 may output data based on the data output control signals RE_RDP and RE_FDP from the fifth cycle of the read enable signal RE_N.

Hereinafter, described with reference to FIGS. 6 and 9B will be the configuration and operation of a data output control circuit 132 in accordance with an embodiment.

According to an embodiment, the data output control circuit 132 may be included in the control circuit 130 of FIG. 3, which is just an example. The arrangement of the data output control circuit 132 will not be limited thereto. According to an embodiment, the data output control circuit 132 may output, as the data output control signal, a signal with timings, at which pulses, among pulses of the read enable signal RE_N, corresponding to the warming-up cycles, are masked based on multiple phase clock signals that are generated by dividing the read enable signals RE_N and RE_C. Therefore, under the low voltage condition (i.e., a condition that an operational voltage is low) and the high-speed operation condition (i.e., a condition that an operational frequency is high), the data output control circuit 132 may stably operate by securing a timing margin twice as great than the data output control circuit 131 configured to perform the masking operation based on the read enable signal RE_N as described with reference to FIG. 4.

Figure 6:
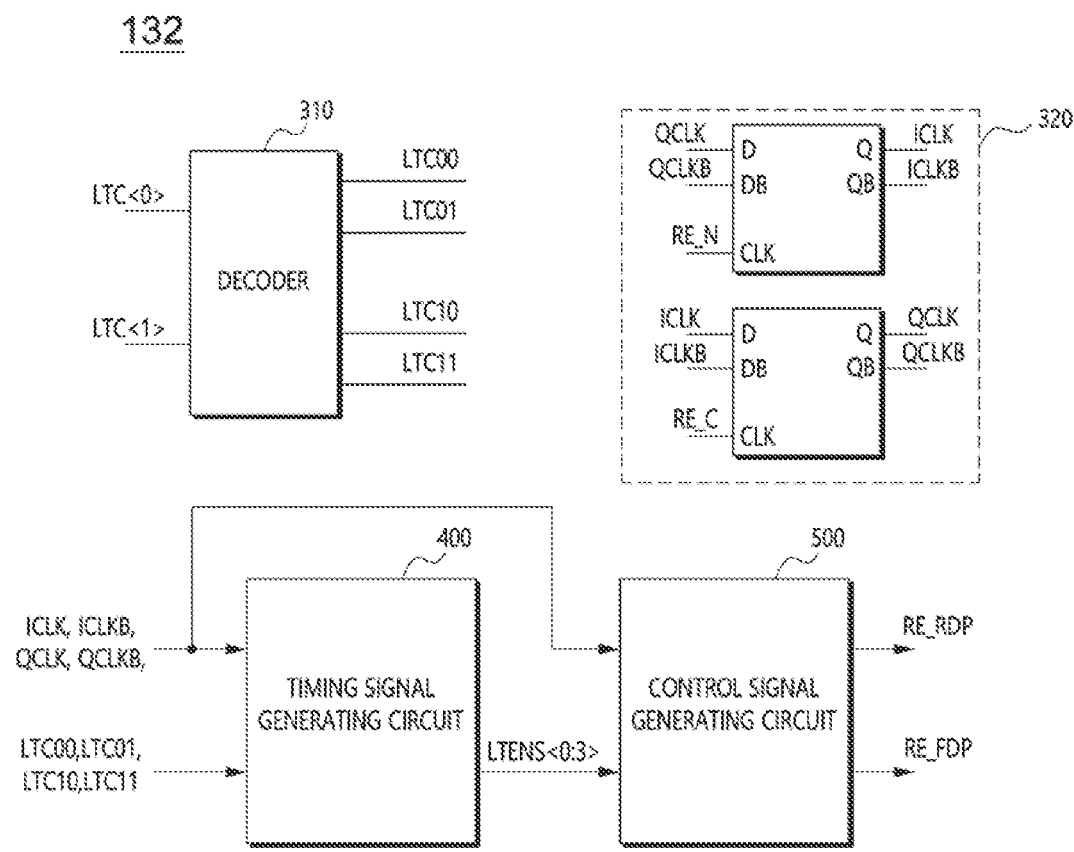
FIG. 6 is a diagram illustrating a configuration of a data output control circuit 132 in accordance with an embodiment.
Figure 7:
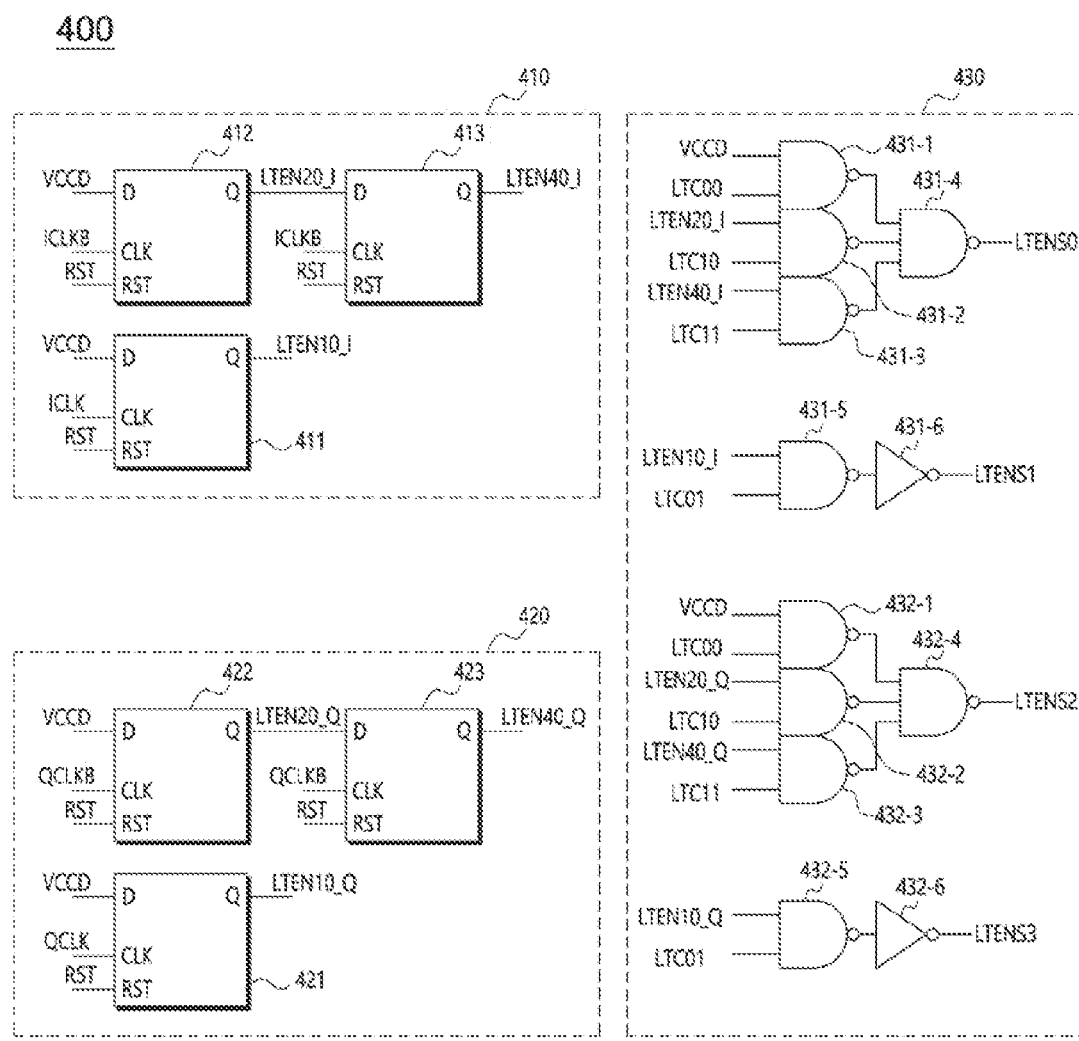
FIG. 7 is a diagram illustrating a configuration of a timing signal generating circuit 400 illustrated in FIG. 6.
Figure 8:
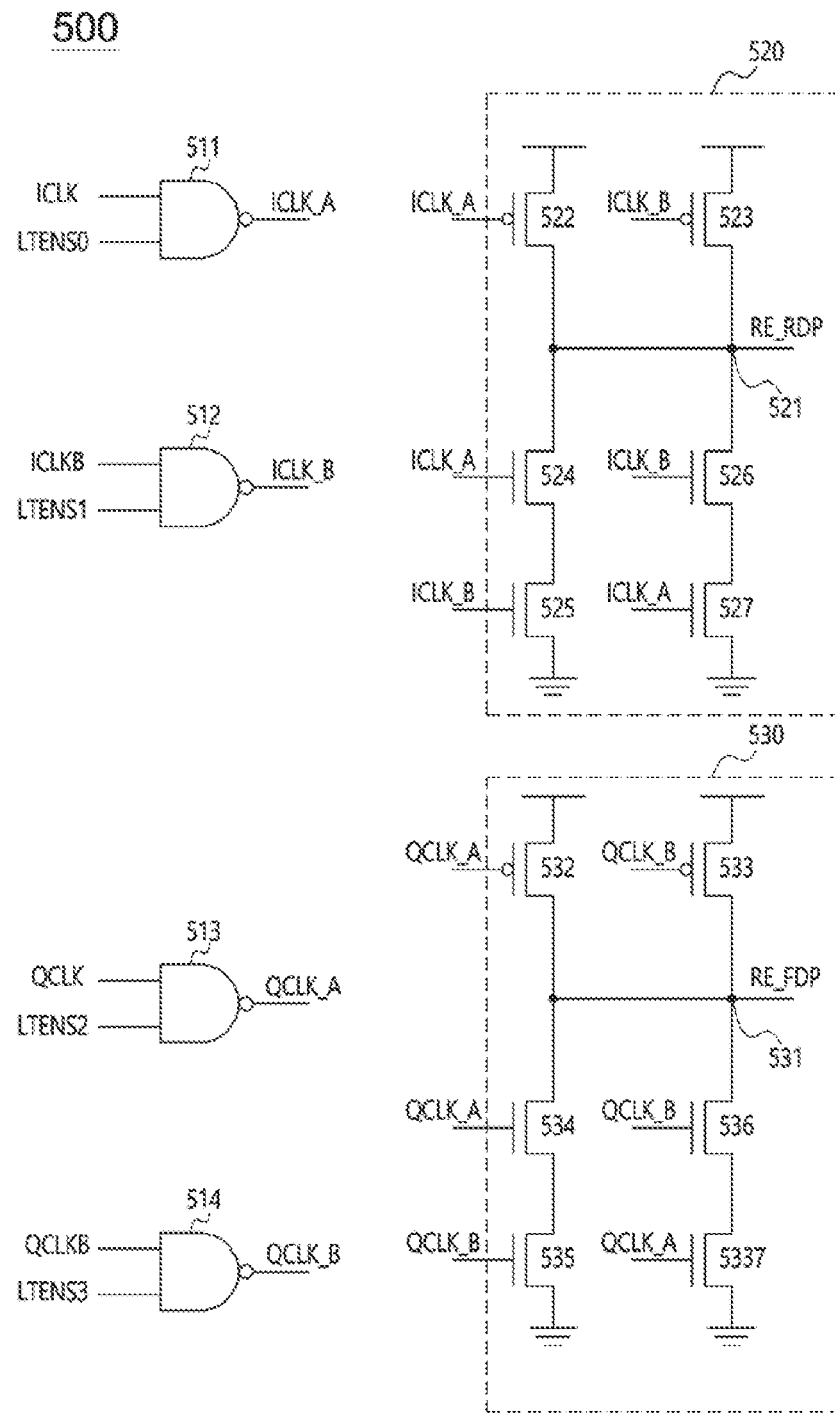
FIG. 8 is a diagram illustrating a configuration of a control signal generating circuit 500 illustrated in FIG. 6.
Figure 9A:
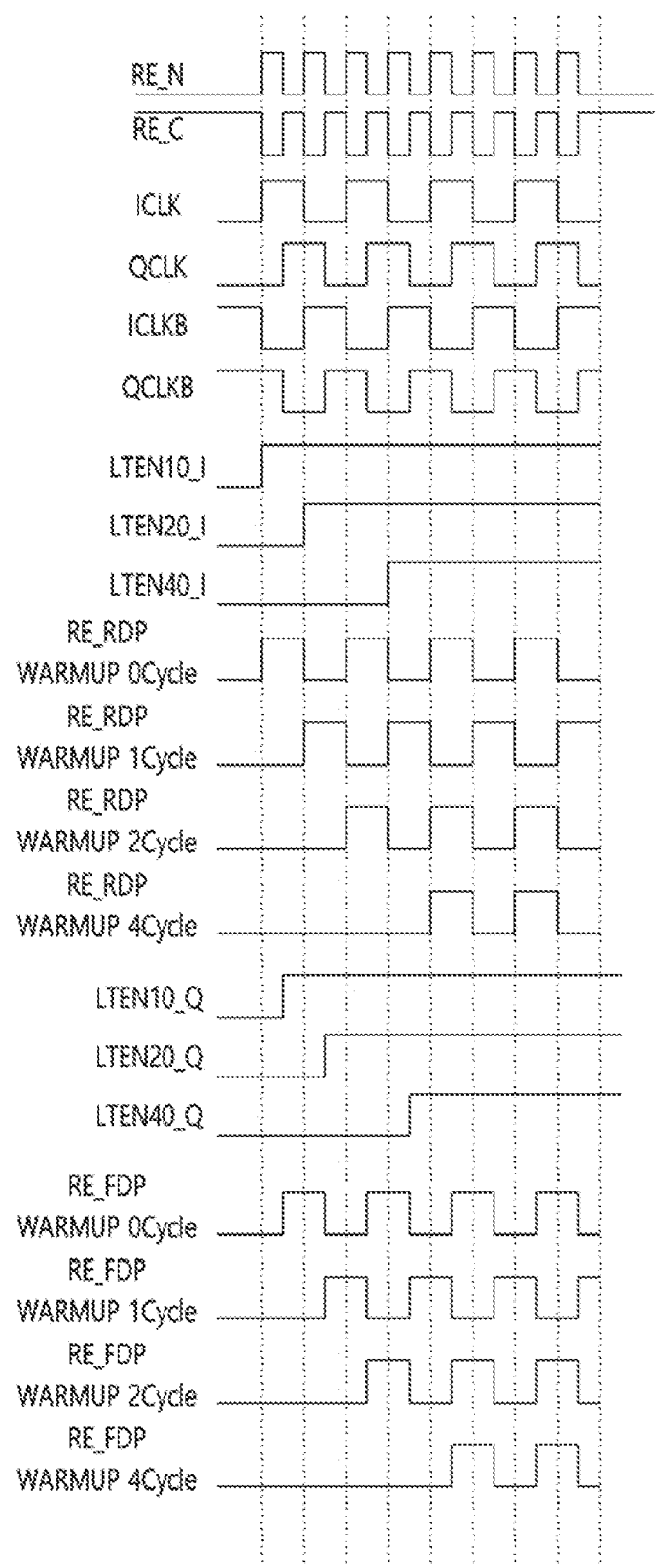
FIGS. 9A and 9B are an operation timing diagram of the data output control circuit 132 in accordance with an embodiment.

FIG. 6 is a diagram illustrating a configuration of the data output control circuit 132 in accordance with an embodiment. FIG. 7 is a diagram illustrating a configuration of a timing signal generating circuit 400 illustrated in FIG. 6. FIG. 8 is a diagram illustrating a configuration of a control signal generating circuit 500 illustrated in FIG. 6. FIGS. 9A and 9B are an operation timing diagram of the data output control circuit 132 in accordance with an embodiment.

According to an embodiment, the data output control circuit 132 may include a decoder 310, a dividing circuit 320, a timing signal generating circuit 400, and a control signal generating circuit 500 as illustrated in FIG. 6.

The decoder 310 may decode warming-up cycle preliminary information LTC<0:1>, which is for setting the warming-up cycle, to generate warming-up cycle information LTC00, LTC01, LTC10, and LTC11.

The dividing circuit 320 may generate multiple phase clock signals ICLK, QCLK, ICLKB, and QCLKB by dividing and separating phases of a pair of read enable signals RE_N and RE_C. Among the multiple phase clock signals ICLK, QCLK, ICLKB, and QCLKB, the phase clock signal ICLK may be referred to as a first phase clock signal ICLK, the phase clock signal QCLK may be referred to as a second phase clock signal QCLK, the phase clock signal ICLKB may be referred to as a third phase clock signal ICLKB, and the phase clock signal QCLKB may be referred to as a fourth phase clock signal QCLKB.

Each of the multiple phase clock signals ICLK, QCLK, ICLKB, and QCLKB may have a half frequency of the read enable signal RE_N. The dividing circuit 320 may include a first flip-flop 321 and a second flip-flop 322.

The first flip-flop 321 may receive, as a clock signal, the read enable signal RE_N of the pair of read enable signals RE_N and RE_C, may receive the second phase clock signal QCLK as a non-inverted input and may receive the fourth phase clock signal QCLKB as an inverted input to generate the first phase clock signal ICLK and the third phase clock signal ICLKB. The first flip-flop 321 may latch the input signals (i.e., the second phase clock signal QCLK and the fourth phase clock signal QCLKB) in response to the transition of the read enable signal RE_N to generate the first phase clock signal ICLK and the third phase clock signal ICLKB.

The second flip-flop 322 may receive, as a clock signal, the read enable signal RE_C of the pair of read enable signals RE_N and RE_C, receive the first phase clock signal ICLK as a non-inverted input, and receive the third phase clock signal ICLKB as an inverted input to generate the second phase clock signal QCLK and the fourth phase clock signal QCLKB. The second flip-flop 322 may latch the input signals (i.e., the first phase clock signal ICLK and the third phase clock signal ICLKB) in response to the transition of the read enable signal RE_C to generate the second phase clock signal QCLK and the fourth phase clock signal QCLKB.

The timing signal generating circuit 400 may generate a plurality of timing signals LTENS<0:3> based on the multiple phase clock signals ICLK, QCLK, ICLKB, and QCLKB and the warming-up cycle information LTC00, LTC01, LTC10, and LTC11.

The control signal generating circuit 500 may generate the data output control signals RE_RDP and RE_FDP based on the multiple phase clock signals ICLK, QCLK, ICLKB, and QCLKB and the plurality of timing signals LTENS<0:3>.

Referring to FIG. 7, the timing signal generating circuit 400 may generate preliminary timing signals LTEN10_I, LTEN20_I, LTEN40_I, LTEN10_Q, LTEN20_Q, and LTEN40_Q based on the multiple phase clock signals ICLK, QCLK, ICLKB, and QCLKB. Also, the timing signal generating circuit 400 may generate the plurality of timing signals LTENS<0:3> by selectively combining the preliminary timing signals LTEN10_I, LTEN20_I, LTEN40_I, LTEN10_Q, LTEN20_Q, and LTEN40_Q based on the warming-up cycle information LTC00, LTC01, LTC10, and LTC11.

The timing signal generating circuit 400 may include a first shift register 410, a second shift register 420, and a multiplexer 430.

The first shift register 410 may generate the preliminary timing signals LTEN10_I, LTEN20_I, and LTEN40_I by shifting the power voltage VCCD based on the first phase clock signal ICLK and the third phase clock signal ICLKB. The first shift register 410 may include a plurality of flip-flops, e.g., first to third flip-flops 411 to 413. The first flip-flop 411 may latch the level of the power voltage VCCD in response to the transition of the first phase clock signal ICLK and may output the latched signal as the preliminary timing signal LTEN10_I. The second flip-flop 412 may latch the level of the power voltage VCCD in response to the transition of the third phase clock signal ICLKB and may output the latched signal as the preliminary timing signal LTEN20_I. The third flip-flop 413 may latch the preliminary timing signal LTEN20_I in response to the transition of the third phase clock signal ICLKB and may output the latched signal as the preliminary timing signal LTEN40_I.

The second shift register 420 may generate the preliminary timing signals LTEN10_Q, LTEN20_Q, and LTEN40_Q by shifting the power voltage VCCD based on the second phase clock signal QCLK and the fourth phase clock signal QCLKB. The second shift register 420 may include a plurality of flip-flops, e.g., first to third flip-flops 421 to 423. The first flip-flop 421 may latch the level of the power voltage VCCD in response to the transition of the second phase clock signal QCLK and may output the latched signal as the preliminary timing signal LTEN10_Q. The second flip-flop 422 may latch the level of the power voltage VCCD in response to the transition of the fourth phase clock signal QCLKB and may output the latched signal as the preliminary timing signal LTEN20_Q. The third flip-flop 423 may latch the preliminary timing signal LTEN20_Q in response to the transition of the fourth phase clock signal QCLKB and may output the latched signal as the preliminary timing signal LTEN40_Q.

The multiplexer 430 may generate the plurality of timing signals LTENS<0:3> by selectively combining the preliminary timing signals LTEN10_I, LTEN20_I, LTEN40_I, LTEN10_Q, LTEN20_Q, and LTEN40_Q based on the warming-up cycle information LTC00, LTC01, LTC10, and LTC11. Among the plurality of timing signals LTENS<0:3>, the timing signal LTENS0 may be referred to as a first timing signal LTENS0, the timing signal LTENS1 may be referred to as a second timing signal LTENS1, the timing signal LTENS2 may be referred to as a third timing signal LTENS2 and the timing signal LTENS3 may be referred to as a fourth timing signal LTENS3.

The multiplexer 430 may include a plurality of logic gates 431-1 to 431-6 and 432-1 to 432-6. The plurality of logic gates 431-1 to 431-6 and 432-1 to 432-6 may be divided into a first logic gate group and a second logic gate group. The first logic gate group may include the first to sixth logic gates 431-1 to 431-6 and the second logic gate group may include the seventh to twelfth logic gate 432-1 to 432-6.

The first logic gate group may generate the first timing signal LETNS<0> and the second timing signal LETNS<1> by combining the preliminary timing signals LTEN10_I, LTEN20_I, and LTEN40_I and the warming-up cycle information LTC00, LTC01, LTC10, and LTC11. The first logic gate 431-1 may perform a NAND operation on the power voltage VCCD and the warming-up cycle information LTC00. The second logic gate 431-2 may perform a NAND operation on the preliminary timing signal LTEN20_I and the warming-up cycle information LTC10. The third logic gate 431-3 may perform a NAND operation on the preliminary timing signal LTEN40_I and the warming-up cycle information LTC11. The fourth logic gate 431-4 may perform a NAND operation on outputs of the first to third logic gates 431-1 to 431-3 to output the first timing signal LTENS0. The fifth logic gate 431-5 may perform a NAND operation on the preliminary timing signal LTEN10_I and the warming-up cycle information LTC01. The sixth logic gate 431-6 may invert an output of the fifth logic gate 431-5 to output the second timing signal LTENS1.

The second logic gate group may generate the third timing signal LETNS<2> and the fourth timing signal LETNS<3> by combining the preliminary timing signals LTEN10_Q, LTEN20_Q, and LTEN40_Q and the warming-up cycle information LTC00, LTC01, LTC10, and LTC11. The seventh logic gate 432-1 may perform a NAND operation on the power voltage VCCD and the warming-up cycle information LTC00. The eighth logic gate 432-2 may perform a NAND operation on the preliminary timing signal LTEN20_Q and the warming-up cycle information LTC10. The ninth logic gate 432-3 may perform a NAND operation on the preliminary timing signal LTEN40_Q and the warming-up cycle information LTC11. The tenth logic gate 432-4 may perform a NAND operation on outputs of the seventh to ninth logic gates 432-1 to 432-3 to output the third timing signal LTENS2. The eleventh logic gate 432-5 may perform a NAND operation on the preliminary timing signal LTEN10_Q and the warming-up cycle information LTC01. The twelfth logic gate 432-6 may invert an output of the eleventh logic gate 432-5 to output the fourth timing signal LTENS3.

Referring to FIG. 8, the control signal generating circuit 500 may generate a plurality of corrected clock signals ICLK_A, QCLK_A, ICLK_B, and QCLK_B by selectively masking the multiple phase clock signals ICLK, QCLK, ICLKB, and QCLKB based on the plurality of timing signals LTENS<0:3>. Also, the control signal generating circuit 500 may generate the data output control signals RE_RDP and RE_FDP by driving output terminals based on the plurality of corrected clock signals ICLK_A, QCLK_A, ICLK_B, and QCLK_B. Among the plurality of corrected clock signals ICLK_A, QCLK_A, ICLK_B, and QCLK_B, the corrected clock signal ICLK_A may be referred to as a first corrected clock signal ICLK_A, the corrected clock signal QCLK_A may be referred to as a second corrected clock signal QCLK_A, the corrected clock signal ICLK_B may be referred to as a third corrected clock signal ICLK_B and the corrected clock signal QCLK_B may be referred to as a fourth corrected clock signal QCLK_B. The control signal generating circuit 500 may include a plurality of logic gates 511 to 514, a first driver 520 and a second driver 530.

The plurality of logic gates 511 to 514 may generate the plurality of corrected clock signals ICLK_A, QCLK_A, ICLK_B, and QCLK_B by selectively masking the multiple phase clock signals ICLK, QCLK, ICLKB and QCLKB based on the plurality of timing signals LTENS<0:3>.

The first logic gate 511 may perform a NAND operation on the first phase clock signal ICLK and the first timing signal LTENS0 to output the first corrected clock signal ICLK_A. The second logic gate 512 may perform a NAND operation on the third phase clock signal ICLKB and the second timing signal LTENS1 to output the third corrected clock signal ICLK_B. The third logic gate 513 may perform a NAND operation on the second phase clock signal QCLK and the third timing signal LTENS2 to output the second corrected clock signal QCLK_A. The fourth logic gate 514 may perform a NAND operation on the fourth phase clock signal QCLKB and the fourth timing signal LTENS3 to output the fourth corrected clock signal QCLK_B.

The first driver 520 may generate the first data output control signal RE_RDP by driving an output terminal 521 to the power voltage level or the ground voltage level based on the first corrected clock signal ICLK_A and the third corrected clock signal ICLK_B. The first driver 520 may include a plurality of transistors 522 to 527.

The first transistor 522 may be coupled between a power voltage node and the output terminal 521 and may drive the output terminal 521 to the power voltage level based on the first corrected clock signal ICLK_A. In parallel with the first transistor 522, the second transistor 523 may be coupled between the power voltage node and the output terminal 521 and may drive the output terminal 521 to the power voltage level based on the third corrected clock signal ICLK_B. The third and fourth transistors 524 and 525 may be serially coupled between the first transistor 522 and a ground terminal and may drive the output terminal 521 to the ground voltage level based on each of the first corrected clock signal ICLK_A and the third corrected clock signal ICLK_B. The fifth and sixth transistors 526 and 527 may be serially coupled between the second transistor 523 and the ground terminal and may drive the output terminal 521 to the ground voltage level based on each of the third corrected clock signal ICLK_B and the first corrected clock signal ICLK_A.

The second driver 530 may generate the second data output control signal RE_FDP by driving an output terminal 531 to the power voltage level or the ground voltage level based on the second corrected clock signal QCLK_A and the fourth corrected clock signal QCLK_B. The second driver 530 may include a plurality of transistors 532 to 537.

The first transistor 532 may be coupled between the power voltage node and the output terminal 531 and may drive the output terminal 531 to the power voltage level based on the second corrected clock signal QCLK_A. In parallel with the first transistor 532, the second transistor 533 may be coupled between the power voltage node and the output terminal 531 and may drive the output terminal 531 to the power voltage level based on the fourth corrected clock signal QCLK_B. The third and fourth transistors 534 and 535 may be serially coupled between the first transistor 532 and the ground terminal and may drive the output terminal 531 to the ground voltage level based on each of the second corrected clock signal QCLK_A and the fourth corrected clock signal QCLK_B. The fifth and sixth transistors 536 and 537 may be serially coupled between the second transistor 533 and the ground terminal and may drive the output terminal 531 to the ground voltage level based on each of the fourth corrected clock signal QCLK_B and the second corrected clock signal QCLK_A.

Referring to FIG. 9A, the multiple phase clock signals ICLK, QCLK, ICLKB, and QCLKB may be generated based on the read enable signals RE_N and RE_C.

The first phase clock signal ICLK and the third phase clock signal ICLKB may be generated by dividing the read enable signal RE_N. The second phase clock signal QCLK and the fourth phase clock signal QCLKB may be generated by dividing the read enable signal RE_C.

The preliminary timing signals LTEN10_I, LTEN20_I, and LTEN40_I may be generated with reference to the first phase clock signal ICLK and the third phase clock signal ICLKB.

According to the preliminary timing signals LTEN10_I, LTEN20_I, and LTEN40_I, the first data output control signal RE_RDP suitable for the warming-up cycle may be generated.

The first data output control signal RE_RDP may have a waveform, which masks the first cycle of the read enable signal RE_N, when the warming-up cycle is set as '1'. The first data output control signal RE_RDP may have a waveform, which masks the first and second cycles of the read enable signal RE_N, when the warming-up cycle is set as '2'. The first data output control signal RE_RDP may have a waveform, which masks the first to fourth cycles of the read enable signal RE_N, when the warming-up cycle is set as '4'.

The preliminary timing signals LTEN10_Q, LTEN20_Q, and LTEN40_Q may be generated with reference to the second phase clock signal QCLK and the fourth phase clock signal QCLKB.

According to the preliminary timing signals LTEN10_Q, LTEN20_Q, and LTEN40_Q, the second data output control signal RE_FDP suitable for the warming-up cycle may be generated.

The second data output control signal RE_FDP may have a waveform, which masks the first cycle of the read enable signal RE_C, when the warming-up cycle is set as '1'. The second data output control signal RE_FDP may have a waveform, which masks the first and second cycles of the read enable signal RE_C, when the warming-up cycle is set as '2'. The second data output control signal RE_FDP may have a waveform, which masks the first to fourth cycles of the read enable signal RE_C, when the warming-up cycle is set as '4'.

Each of the multiple phase clock signals ICLK, QCLK, ICLKB, and QCLKB may have a half frequency of each of the read enable signals RE_N and RE_C. Therefore, the first data output control signal RE_RDP and second data output control signal RE_FDP may be stably generated despite the operational condition of the semiconductor apparatus 100 (i.e., even when the semiconductor apparatus 100 operates under the low voltage condition or the high-frequency operation condition).

Figure 9B:
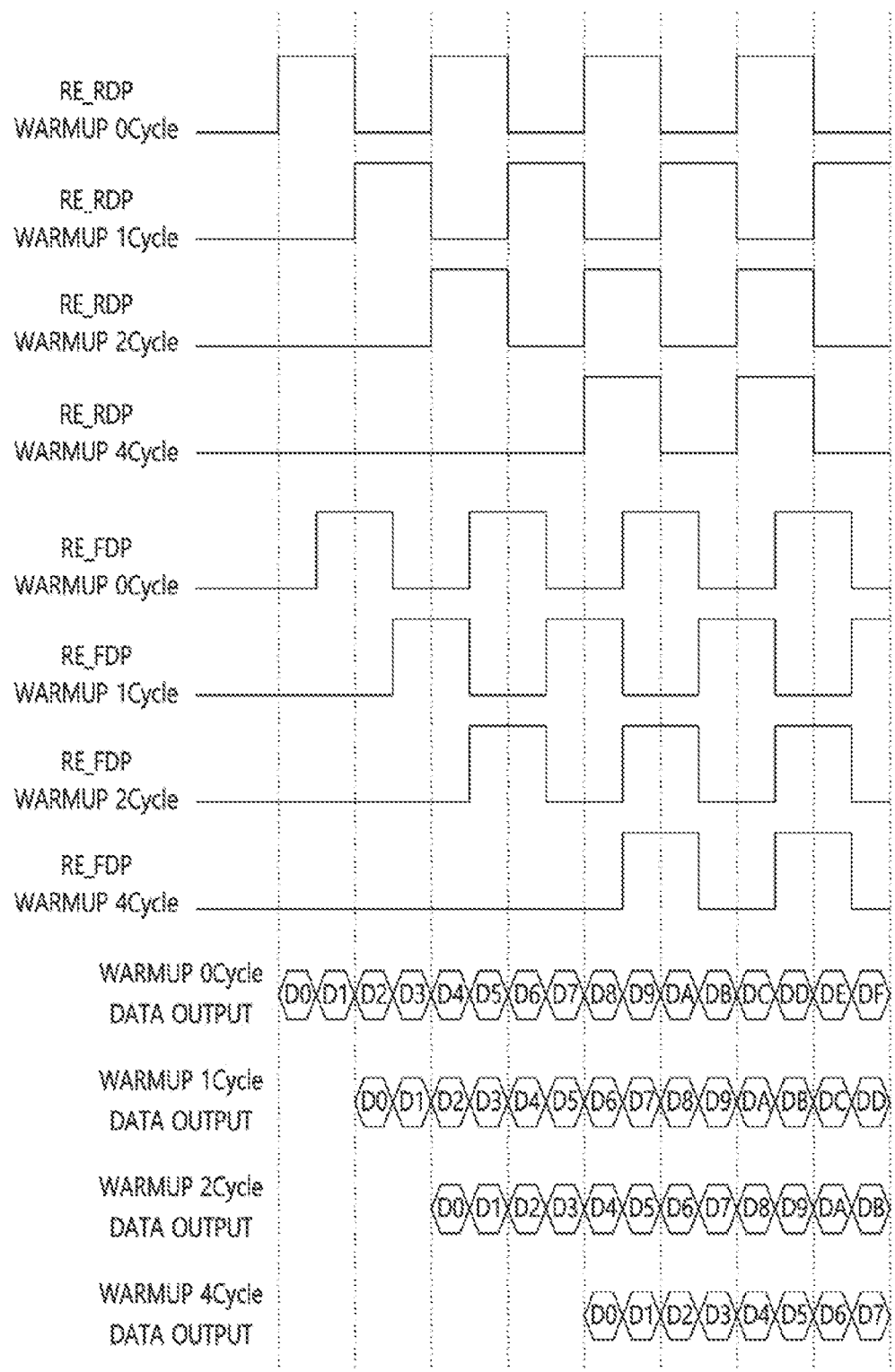

Referring to FIG. 9B, the semiconductor apparatus 100 may output data based on each of the data output control signals RE_RDP and RE_FDP from the first cycle of the read enable signal RE_N when the warming-up cycle is set as '0' (i.e., when the warming-up cycle is not applied).

The semiconductor apparatus 100 may output data based on each of the data output control signals RE_RDP and RE_FDP from the second cycle of the read enable signal RE_N when the warming-up cycle is set as '1'.

The semiconductor apparatus 100 may output data based on each of the data output control signals RE_RDP and RE_FDP from the third cycle of the read enable signal RE_N when the warming-up cycle is set as '2'.

The semiconductor apparatus 100 may output data based on each of the data output control signals RE_RDP and RE_FDP from the fifth cycle of the read enable signal RE_N when the warming-up cycle is set as '4'.

While certain embodiments have been described above, it will be understood to those skilled in the art that the embodiments described are by way of example only. Accordingly, the data output control circuit and semiconductor apparatus including the same should not be limited based on the described embodiments. Rather, the data output control circuit and semiconductor apparatus including the same described herein should only be limited in light of the claims that follow when taken in conjunction with the above description and accompanying drawings.

What is claimed is:

1. A data output control circuit comprising:
    a dividing circuit configured to divide read enable signals to generate multiple phase clock signals;
    a timing signal generating circuit configured to generate a plurality of timing signals based on warming-up cycle information and the multiple phase clock signals; and
    a control signal generating circuit configured to generate data output control signals based on the multiple phase clock signals and the plurality of timing signals.

2. The data output control circuit of claim 1, further comprising a decoder configured to decode warming-up cycle preliminary information, which is for setting a warming-up cycle, to generate the warming-up cycle information.

3. The data output control circuit of claim 1, wherein the dividing circuit includes:
    a first flip-flop configured to latch, in response to a transition of a first signal, among the read enable signals, input signals to generate a first phase clock signal and a third phase clock signal, among the multiple phase clock signals; and
    a second flip-flop configured to latch, in response to a transition of a second signal, among the read enable signals, input signals to generate a second phase clock signal and a fourth phase clock signal, among the multiple phase clock signals.

4. The data output control circuit of claim 1, wherein the timing signal generating circuit is configured to generate the plurality of timing signals by generating preliminary timing signals based on the multiple phase clock signals and by selectively combining the preliminary timing signals based on the warming-up cycle information.

5. The data output control circuit of claim 1, wherein the timing signal generating circuit includes:
    a first shift register configured to shift a power voltage based on a first phase clock signal and a third phase clock signal, among the multiple phase clock signals, to generate a part of preliminary timing signals;
    a second shift register configured to shift a power voltage based on a second phase clock signal and a fourth phase clock signal, among the multiple phase clock signals, to generate the other parts of the preliminary timing signals; and
    a multiplexer configured to selectively combine the preliminary timing signals based on the warming-up cycle information to generate the plurality of timing signals.

6. The data output control circuit of claim 1, wherein the control signal generating circuit is configured to generate the data output control signals by selectively masking the multiple phase clock signals based on the plurality of timing signals to generate a plurality of corrected clock signals and by driving an output terminal based on the plurality of corrected clock signals.

7. The data output control circuit of claim 1, wherein the control signal generating circuit includes:
   a plurality of logic gates configured to selectively mask the multiple phase clock signals based on the plurality of timing signals to generate a plurality of corrected clock signals;
   a first driver configured to drive an output terminal to a power voltage level or a ground voltage level based on a first corrected clock signal and a third corrected clock signal, among the plurality of corrected clock signals, to generate a first data output control signal, among the data output control signals; and
   a second driver configured to drive an output terminal to a power voltage level or a ground voltage level based on a second corrected clock signal and a fourth corrected clock signal, among the plurality of corrected clock signals, to generate a second data output control signal, among the data output control signals.

8. A semiconductor apparatus comprising:
   a memory cell array;
   a data input/output circuit configured to output data from the memory cell array to an external device in response to data output control signals; and
   a control circuit configured to generate the data output control signals by dividing read enable signals, which are provided from another external device, to generate multiple phase clock signals and by selectively masking the multiple phase clock signals based on warming-up cycle information that is set for the semiconductor apparatus.

9. The semiconductor apparatus of claim 8, wherein the memory cell array includes a plurality of memory blocks, each including a plurality of pages.

10. The semiconductor apparatus of claim 8, further comprising a read/write circuit, including a plurality of pages buffers, coupled to the memory cell array through bit lines.

11. The semiconductor apparatus of claim 8, wherein the control circuit includes:
   a decoder configured to decode warming-up cycle preliminary information, which is for setting a warming-up cycle, to generate the warming-up cycle information;
   a dividing circuit configured to divide the read enable signals to generate the multiple phase clock signals;
   a timing signal generating circuit configured to generate a plurality of timing signals based on the warming-up cycle information and the multiple phase clock signals; and
   a control signal generating circuit configured to generate the data output control signals based on the multiple phase clock signals and the plurality of timing signals.

12. The semiconductor apparatus of claim 11, wherein the timing signal generating circuit is configured to generate the plurality of timing signals by generating preliminary timing signals based on the multiple phase clock signals and by selectively combining the preliminary timing signals based on the warming-up cycle information.

13. The semiconductor apparatus of claim 11, wherein the timing signal generating circuit includes:
   a first shift register configured to shift a power voltage based on a first phase clock signal and a third phase clock signal, among the multiple phase clock signals, to generate a part of preliminary timing signals;
   a second shift register configured to shift a power voltage based on a second phase clock signal and a fourth phase clock signal, among the multiple phase clock signals, to generate the other parts of the preliminary timing signals; and
   a multiplexer configured to selectively combine the preliminary timing signals based on the warming-up cycle information to generate the plurality of timing signals.

14. The semiconductor apparatus of claim 11, wherein the control signal generating circuit is configured to generate the data output control signals by selectively masking the multiple phase clock signals based on the plurality of timing signals to generate a plurality of corrected clock signals and by driving an output terminal based on the plurality of corrected clock signals.

15. The semiconductor apparatus of claim 11, wherein the control signal generating circuit includes:
   a plurality of logic gates configured to selectively mask the multiple phase clock signals based on the plurality of timing signals to generate a plurality of corrected clock signals;
   a first driver configured to drive an output terminal to a power voltage level or a ground voltage level based on a first corrected clock signal and a third corrected clock signal, among the plurality of corrected clock signals, to generate a first data output control signal, among the data output control signals; and
   a second driver configured to drive an output terminal to a power voltage level or a ground voltage level based on a second corrected clock signal and a fourth corrected clock signal, among the plurality of corrected clock signals, to generate a second data output control signal, among the data output control signals.

\* \* \* \* \*